(12) United States Patent
Feldman

(10) Patent No.: US 8,564,111 B2
(45) Date of Patent: Oct. 22, 2013

(54) STACKED DIGITAL/RF SYSTEM-ON-CHIP WITH INTEGRAL ISOLATION LAYER

(75) Inventor: Neil David Feldman, Moreshet (IL)

(73) Assignee: Siano Mobile Silicon Ltd., Kfar Netter (IL)

( * ) Notice: Subject to any disclaimer, the term of this patent is extended or adjusted under 35 U.S.C. 154(b) by 350 days.

(21) Appl. No.: 13/014,729

(22) Filed: Jan. 27, 2011

(65) Prior Publication Data

US 2012/0195396 A1    Aug. 2, 2012

(51) Int. Cl.
*H01L 23/52*    (2006.01)

(52) U.S. Cl.
USPC ....................................... 257/690

(58) Field of Classification Search
USPC ................................. 257/686, 690
See application file for complete search history.

(56) References Cited

U.S. PATENT DOCUMENTS

2006/0091517 A1* 5/2006 Yoo et al. ................. 257/686
2008/0237825 A1 10/2008 Tay et al.

OTHER PUBLICATIONS

Jackson et al., "Processing and integration of copper interconnects", Solid State Technology, vol. 41, No. 3, pp. 49-59, 1998.
Pctechguide, "Copper interconnect", Apr. 18, 2004 (www.pctechguide.com/21Architecture_Copper_interconnect.htm).

* cited by examiner

*Primary Examiner* — Bradley K Smith
(74) *Attorney, Agent, or Firm* — D. Kligler I.P. Services Ltd.

(57) ABSTRACT

An apparatus includes a device package, a first Integrated Circuit (IC) that is packaged in the device package, and a second IC, which is packaged in the device package and is fabricated on a multi-layer interconnection circuit including a plurality of interconnection layers for interconnecting components of the second IC, wherein a selected layer in the plurality is configured to serve as a conductive shield for reducing interference between the first and second ICs.

6 Claims, 1 Drawing Sheet

STACKED DIGITAL/RF SYSTEM-ON-CHIP WITH INTEGRAL ISOLATION LAYER

FIELD OF THE INVENTION

The present invention relates generally to integrated circuits, and particularly to methods and devices for reducing interference in multi-chip device packages.

BACKGROUND OF THE INVENTION

Radio Frequency (RF) communication devices such as receivers and transmitters are sometimes implemented using multi-die packages, which are referred to as Multi-Chip Packages (MCP), Multi-Chip Modules (MCM), Systems-in-Package (SiP) or Systems-on-Chip (SoC). When multiple dies are packaged in a single package, signals emitted from one die may interfere with the operation of another die.

Various techniques have been proposed for reducing inter-die interference. For example, U.S. Patent Application Publication 2008/0237825, whose disclosure is incorporated herein by reference, describes a stacked integrated circuit package that includes a first device and a second device. A conductive spacer structure, having a spacer filler around a conductive element, is formed over the first device. The second device is mounted over the conductive spacer structure. The first device, the second device, and the conductive spacer structure are encapsulated.

SUMMARY OF THE INVENTION

An embodiment of the present invention that is described herein provides an apparatus, including:

a device package;

a first Integrated Circuit (IC) that is packaged in the device package; and a second IC, which is packaged in the device package and is fabricated on a multi-layer interconnection circuit including a plurality of interconnection layers for interconnecting components of the second IC, wherein a selected layer in the plurality is configured to serve as a conductive shield for reducing interference between the first and second ICs.

In some embodiments, the selected layer is not used for interconnecting any of the components. In an embodiment, one of the first and second ICs includes a digital IC, and the other of the first and second ICs includes a Radio Frequency IC (RFIC). In a disclosed embodiment, the first and second ICs are stacked one on top of the other in the device package. In another embodiment, the interconnection layers, including the selected layer, are formed jointly in a single fabrication process of the multi-layer interconnection circuit. In some embodiments, the single fabrication process includes a copper interconnect process.

There is additionally provided, in accordance with an embodiment of the present invention, a method for fabricating a System-on-Chip (SoC), the method including:

packaging a first Integrated Circuit (IC) in a device package; and packaging in the device package a second IC, which is fabricated on a multi-layer interconnection circuit including a plurality of interconnection layers for interconnecting components of the second IC, wherein a selected layer in the plurality is configured to serve as a conductive shield for reducing interference between the first and second ICs.

There is also provided, in accordance with an embodiment of the present invention, a method for reception, including:

receiving a Radio Frequency (RF) signal using a RF Integrated Circuit (RFIC) that is packaged in a device package;

processing the received signal using a digital IC that is packaged together with the RFIC in the device package, wherein one of the RFIC and the digital IC is fabricated on a multi-layer interconnection circuit including a plurality of interconnection layers for interconnecting components of the one of the RFIC and the digital IC, and wherein a selected layer in the plurality is configured to serve as a conductive shield for reducing interference between the RFIC and the digital IC.

In some embodiments, receiving and processing the signal include receiving and processing a Mobile Digital Television (MDTV) signal. In some embodiments, the interference includes leakage of a clock signal, which is generated in the digital IC, into the RFIC.

The present invention will be more fully understood from the following detailed description of the embodiments thereof, taken together with the drawings in which:

DETAILED DESCRIPTION OF EMBODIMENTS

Overview

When two or more Integrated Circuits (ICs) are packaged in close proximity to one another in the same device package, signals generated in one IC may radiate and cause interference in another IC. For example, when a receiver or transmitter comprises a digital IC and a Radio Frequency IC (RFIC) that are packaged in a single device package, signals generated in the digital IC may cause interference in the RFIC, and vice versa.

Embodiments of the present invention that are described herein provide improved methods and devices for reducing interference between ICs that are packaged in the same package. In some embodiments, at least one of the ICs in the package is fabricated on a multi-layer substrate, which comprises multiple interconnection layers for interconnecting the IC components. One of the layers in the multi-layer structure, however, is not used for interconnection but rather serves as an electrically-conductive shield that reduces signal radiation into and out of the IC. This layer, which is typically grounded, reduces or eliminates interference between the IC and other ICs in the package.

Although it is possible in principle to reduce inter-chip interference by inserting various metal separators between the ICs in the package, this solution is typically expensive, complicated to manufacture and increases the package size considerably. The disclosed techniques, on the other hand, reduce interference using a metalized layer that is produced inherently as part of the manufacturing process of one of the ICs. Devices that use the disclosed techniques, such as receivers or transmitters, are therefore small in size and cost, and simple to manufacture and assemble.

Since the disclosed shielding layer is an integral part of one of the ICs, interference suppression is predictable, stable over varying operating conditions, repeatable and easy to test. Moreover, since the disclosed shielding layer is closer to the sources of the interfering signals, the achievable interference suppression is higher than that of an external separator.

System Description

Figure 1:
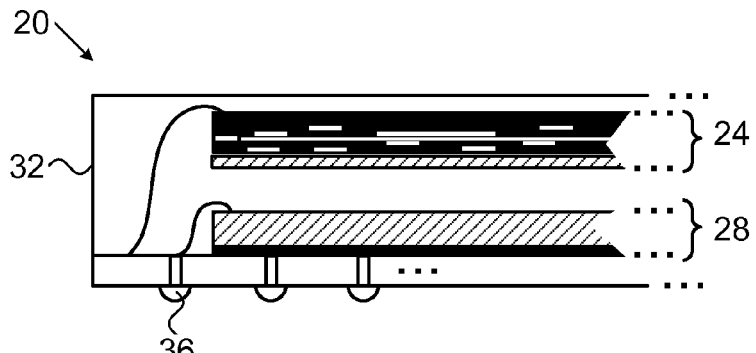
FIG. 1 is a schematic cross-section of a System-on-Chip (SoC), in accordance with an embodiment of the present invention.

FIG. 1 is a schematic cross-section of a multi-die System-on-Chip (SoC) 20, in accordance with an embodiment of the present invention. SoC 20 comprises a digital IC 24 and a RFIC 28, which are stacked one above the other and packaged in a device package 32. The SoC further comprises internal interconnections between the digital IC and the RFIC, as well as interconnections to device pads 36. In the present example, SoC 20 comprises a Mobile Digital Television (MDTV) receiver. In this embodiment, RFIC 28 receives a RF MDTV signal, and digital IC 24 processes the received signal. In alternative embodiments, however, the disclosed techniques can be used with various other kinds of ICs and in various other SoC applications.

The SoC configuration shown in FIG. 1 is an example configuration that is chosen purely for the sake of conceptual clarity. In alternative embodiments, any other suitable SoC configuration can be used. For example, the SoC may comprise only digital ICs, only RFICs, more than two ICs of any desired type, or any other suitable set of ICs. The ICs may be packaged in package 32 using any suitable geometry and/or technology, not necessarily in a stacked configuration.

ICs 24 and 28 in SoC 20 generate and use various signals, such as clock signals, Local Oscillator (LO) signals or any other type of signals. Since the ICs in package 32 are located in close proximity to one another, signals that are generated in one IC may radiate from this IC and cause interference in another IC. For example, a clock signal that is generated in digital IC 24 may radiate and appear as a spurious signal in RFIC 28, and thus degrade the receiver performance. Interference of this sort is particularly harmful in receivers that process weak RF signals, but may be generally problematic in any SoC.

Reducing Inter-Chip Signal Interference Using Integral Insulation Layer

In some embodiments, one of the ICs in SoC 20 comprises an integral isolation layer that reduces signal radiation into and out of the IC. In the embodiments described herein, this insulation layer is part of digital IC 24. Alternatively, however, an insulation layer of this sort can be produced as part of any other suitable IC, such as RFIC 28.

Figure 2:
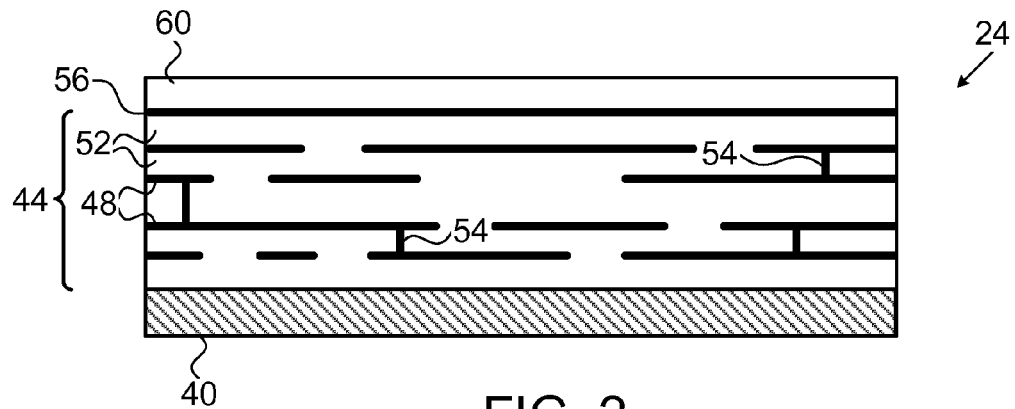
FIG. 2 is a schematic cross-section of a digital chip with an integral insulation layer, in accordance with an embodiment of the present invention.

FIG. 2 is a schematic cross-section of digital IC 24, in accordance with an embodiment of the present invention. IC 24 comprises a semiconductor substrate 40, which comprises the various electronic components (e.g., transistors, diodes, resistors, capacitors and inductors) of the IC. IC 24 comprises a multi-layer interconnection circuit 44, for interconnecting the various IC components. The multi-layer interconnection circuit comprises multiple printed conductive layers 48. The interconnection layers are separated from one another using dielectric layers 52, to form a stacked multi-layer structure that enables the desired signal routing between the IC components. Each layer 48 comprises suitable circuit traces for routing signals. Interconnection between layers is carried out using conductive vias 54.

In some embodiments, one or more passivation layers 60 are applied to circuit 44. Layers 60 are typically glass-based. In some embodiments, a certain air gap is retained between circuit 44 and layers 60.

Digital IC 24 may be fabricated using various materials and processes. In the present example substrate 40 comprises Silicon, but may alternatively comprise Gallium Arsenide (GaAs). Interconnection layers 48 typically comprise Copper, but may alternatively comprise Aluminum or any other electrically-conductive metal layers. Dielectric layers 52 typically comprise Silicon Dioxide ($SiO_2$), but may alternatively comprise any other suitable material.

The layer thickness of layers 48 is typically on the order of 3000 Å, the thickness of layers 52 is typically on the order of 6000 Å, and the thickness of substrate 40 is typically on the order of 10000 Å. A typical digital IC comprises between five and eight layers 48. The overall thickness of digital IC 24, in one example embodiment, is on the order of 12 mil, although the overall thickness may vary considerably in alternative embodiments. When the disclosed techniques are applied in a RFIC, the semiconductor substrate may comprise Silicon, the interconnection layers may comprise Copper, and the dielectric layers may comprise $SiO_2$. The materials and sizes listed above are given purely by way of example. In alternative embodiments, any other suitable materials and sizes can be used.

In some embodiments, one of the layers in the multi-layer structure of interconnection circuit 44 is not used for interconnection and does not carry signals, but is used for shielding IC 24 from signal radiation. This integral shielding layer is produced together with interconnection layers 48 in the same manufacturing process of circuit 44. In the example of FIG. 2, the integral shielding layer is denoted 56, and is located at the interface of circuit 44 with layers 60.

The multi-layer structure of interconnection circuit 44 can be manufactured using various processes. In some embodiments, interconnection layers 48 and shielding layer 56 are manufactured jointly using a copper interconnect process, such as a 90 nm copper process. Copper interconnect processes are described, for example, by Jackson et al. in "Processing and Integration of Copper Interconnects," Solid State Technology, Volume 41, No. 3, 1998, pages 49-59, which is incorporated herein by reference. Alternatively, interconnection layers 48 and shielding layer 56 can be manufactured jointly using any other suitable manufacturing process.

In some embodiments, shielding layer 56 comprises electrically-conductive material that covers substantially the entire surface of circuit 44, and is typically connected to ground. As such, layer 56 reduces or eliminates signal radiation into and out of IC 24. In alternative embodiments, the electrically-conductive material in layer 56 does not cover the entire surface, but is disposed in a sufficiently dense pattern that effectively reduces signal radiation. The characteristics of layer 56 (e.g., thickness and pattern density) may depend, for example, on the fabrication capabilities of the silicon vendor. The material composition of layer 56 typically depends on the overall fabrication process of circuit 44, since layer 56 is fabricated together with layers 48 in the same process.

The mechanical and electrical configuration of IC 24 shown in FIG. 2 is an example configuration, which is chosen purely by way of example. In alternative embodiments, any other suitable configuration can be used.

Figure 3:
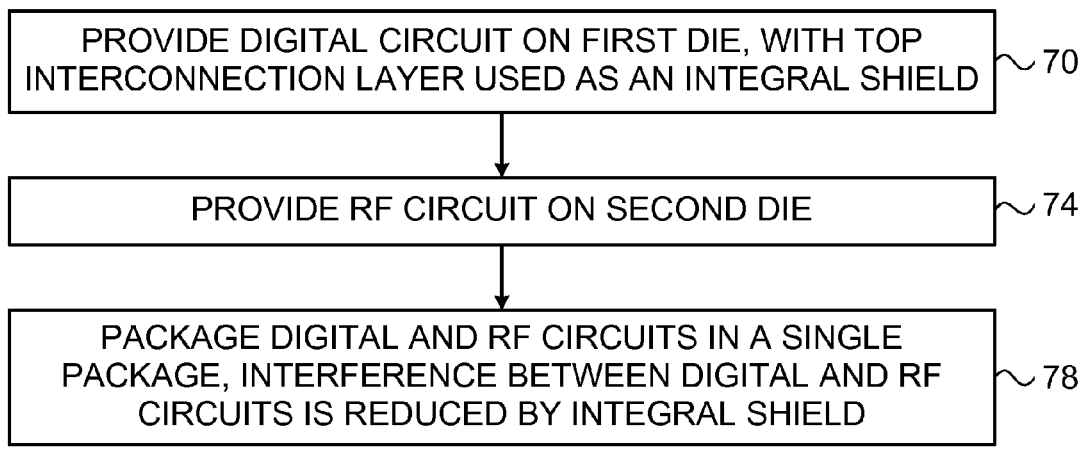
FIG. 3 is a flow chart that schematically illustrates a method for fabricating a SoC, in accordance with an embodiment of the present invention.

FIG. 3 is a flow chart that schematically illustrates a method for fabricating SoC 20, in accordance with an embodiment of the present invention. The method begins with providing digital IC 24, whose top interconnection layer is used as an integral shielding layer, at a first IC providing step 70. RFIC 28 is provided, at a second IC providing step 74. ICs 24 and 28 are packaged in device package 32, at a packaging step 78. Because of the shielding provided by layer 56 of IC 24, interference due to signal radiation between ICs 24 and 28 is effectively suppressed.

Although the embodiments described herein refer mainly to MDTV receivers, the disclosed techniques are in no way limited to MDTV and can be used in any other suitable receiver, such as in Bluetooth (BT), Wireless Local Area Network (WLAN, also referred to as WiFi) or WiMAX receivers. Moreover, although the embodiments described herein mainly address interference reduction in integrated receivers and transmitters, the methods and systems described herein can also be used in other applications, e.g., other devices comprising a noisy digital die and a sensitive analog die.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. Apparatus, comprising:
   a device package;
   a first Integrated Circuit (IC) that is packaged in the device package; and
   a second IC, which is packaged in the device package and is fabricated on a multi-layer substrate comprising a plurality of interconnection layers for interconnecting components of the second IC, wherein a selected interconnection layer inside the multi-layer substrate is configured to serve as a conductive shield for reducing interference between the first and second ICs.

2. The apparatus according to claim 1, wherein the selected interconnection layer is not used for interconnecting any of the components.

3. The apparatus according to claim 1, wherein one of the first and second ICs comprises a digital IC, and wherein the other of the first and second ICs comprises a Radio Frequency IC (RFIC).

4. The apparatus according to claim 1, wherein the first and second ICs are stacked one on top of the other in the device package.

5. The apparatus according to claim 1, wherein the interconnection layers, including the selected interconnection layer, are formed jointly in a single fabrication process of the multi-layer substrate.

6. The apparatus according to claim 5, wherein the single fabrication process comprises a copper interconnect process.

* * * * *